(12) United States Patent
Fukarek et al.

(10) Patent No.: US 9,297,065 B2
(45) Date of Patent: Mar. 29, 2016

(54) VACUUM TREATMENT OF STRIP-SHAPED SUBSTRATES

(75) Inventors: Wolfgang Fukarek, Burkau (DE); Bontscho Bontschew, Dresden (DE)

(73) Assignee: LEYBOLD OPTICS GMBH (DE)

( * ) Notice: Subject to any disclaimer, the term of this patent is extended or adjusted under 35 U.S.C. 154(b) by 1307 days.

(21) Appl. No.: 12/528,558

(22) PCT Filed: Feb. 26, 2008

(86) PCT No.: PCT/EP2008/001507
§ 371 (c)(1),
(2), (4) Date: Mar. 2, 2010

(87) PCT Pub. No.: WO2008/104362
PCT Pub. Date: Sep. 4, 2008

(65) Prior Publication Data
US 2010/0215848 A1    Aug. 26, 2010

(30) Foreign Application Priority Data

Feb. 26, 2007    (DE) .................... 10 2007 009 615 U

(51) Int. Cl.
*C23C 14/56*    (2006.01)
*C23C 16/54*    (2006.01)

(52) U.S. Cl.
CPC .................................. *C23C 14/562* (2013.01)

(58) Field of Classification Search
CPC ...... C23C 16/54; C23C 16/545; C23C 14/56; C23C 14/562; C23C 14/568; H01L 21/67155; H01L 21/67161; H01L 21/67167; H01L 21/67173; H01L 21/67184; H01L 21/67196; H01L 21/67703; H01L 21/6776
See application file for complete search history.

(56) References Cited

U.S. PATENT DOCUMENTS 4,261,808 A * 4/1981 Walter ..................... 204/298.25
4,643,915 A * 2/1987 Arai et al. ..................... 427/130
(Continued)

FOREIGN PATENT DOCUMENTS

DE    19735603        11/1998
DE    19735603 C1 *  11/1998
(Continued)

OTHER PUBLICATIONS

Japanese Office Action for corresponding JP application JP2009-551127 dated Dec. 3, 2012; Mail date Dec. 7, 2012.
(Continued)

*Primary Examiner* — Jeffrie R Lund
*Assistant Examiner* — Yuechuan Yu
(74) *Attorney, Agent, or Firm* — Cantor Colburn LLP

(57) ABSTRACT

A treatment installation for vacuum treatment of a front side of strip substrates includes first and second process chambers, each process chamber including a process roller and at least one process source. A transfer chamber arranged between the process chambers is coupled with both process chambers and can be separated in terms of pressure from at least one of the process chambers. The transfer chamber further includes an unwinding device with a removable unwinding reel and a winding-up device with a removable winding-up reel for the substrate and an outside air lock for loading and unloading the unwinding reel and/or winding-up reel. The rear side of the substrate faces the two process rollers and can be guided through the transfer chamber from the unwinding device to the first process roller, from the first process roller to the second process roller and from the second process roller to the winding-up device.

15 Claims, 1 Drawing Sheet

(56) References Cited

U.S. PATENT DOCUMENTS

| | | | |
|---|---|---|---|
| 5,338,422 A * | 8/1994 | Belkind et al. | 204/192.12 |
| 6,632,520 B1 * | 10/2003 | Hiramoto et al. | 428/336 |
| 2004/0063320 A1 | 4/2004 | Hollars | |
| 2006/0073283 A1 | 4/2006 | Brown et al. | |
| 2006/0159844 A1 | 7/2006 | Moriwaki et al. | |
| 2007/0169695 A1 | 7/2007 | Schneiders et al. | |

FOREIGN PATENT DOCUMENTS

| | | | |
|---|---|---|---|
| DE | 10157186 | | 1/2003 |
| DE | 10 2005 042 762 A1 | | 4/2006 |
| EP | 1764425 A1 | | 3/2007 |
| JP | 55118931 A | * | 9/1980 |
| JP | 58141380 A | * | 8/1983 |
| JP | 62230983 | | 10/1987 |
| JP | 62230983 A | * | 10/1987 |
| JP | 63206470 | | 8/1988 |
| JP | 6-2954 A | | 1/1994 |
| JP | 06184748 | | 7/1994 |
| JP | 06184748 A | * | 7/1994 |
| JP | 6320464 | | 11/1994 |
| JP | 8-506855 A | | 7/1996 |
| JP | 2000327186 A | * | 11/2000 |
| JP | 2001002806 A | * | 1/2001 |
| JP | 2002309371 A | * | 10/2002 |
| JP | 2004307890 A | * | 11/2004 |
| JP | 2004344728 A | * | 12/2004 |
| JP | 2005515299 A | | 5/2005 |
| TW | 404986 B | | 9/2000 |
| TW | 476801 B | | 2/2002 |
| TW | 539752 B | | 7/2003 |
| TW | 1251030 B | | 3/2006 |
| WO | 9950472 | | 10/1999 |
| WO | 2005116289 | | 12/2005 |

OTHER PUBLICATIONS

International Search Report PCT/ EP2008/001507; Dated Jun. 30, 2009.

* cited by examiner

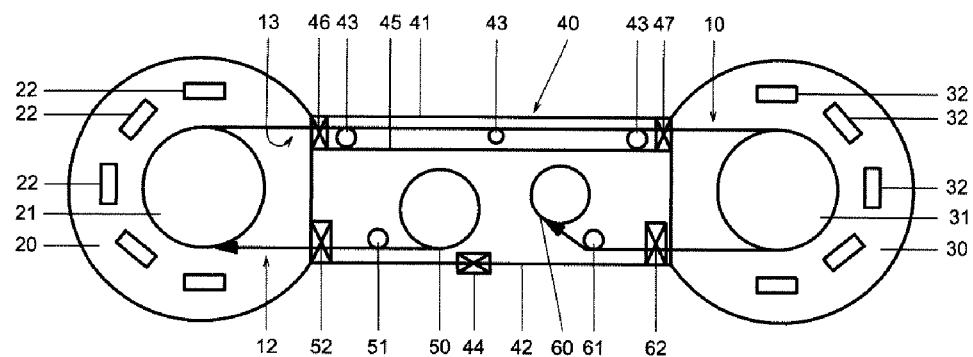

VACUUM TREATMENT OF STRIP-SHAPED SUBSTRATES

TECHNICAL FIELD OF THE INVENTION

The invention relates to a treatment installation for the vacuum treatment, in particular vacuum coating, of a front side of substrates in strip form comprising a process chamber and a process roller and at least one process source and a second process chamber with a process roller and at least one process source.

BRIEF DESCRIPTION OF RELATED ART

Substrates in strip form may be metal strips, magnetic tapes, films, sheets of plastic or the like that are exposed to the process source, for example for coating. Usually used as the process source are sputter sources, in particular magnetron sputter sources, vapor coating, plasma, physical vapor deposition or chemical vapor deposition sources (PVD or CVD sources). Furthermore, these sources may also serve for a pretreatment, cleaning, drying, surface activation and/or polymerization of the substrate to be coated. The use of two process chambers with process sources allows the throughput of such an installation to be increased in comparison with an installation with only one process chamber.

DE 101 571 86 C1 discloses a vacuum coating installation for coating material in strip form in process chambers in which an unwinding device with an inserted unwinding reel for the material in strip form to be coated is arranged in a first evacuable reel chamber and a winding-up device with a removable winding-up reel for the material to be coated is arranged in a second evacuable reel chamber. The material in strip form to be coated runs through two process chambers comprising guiding devices with a number of deflecting rollers for the substrate in strip form.

JP 00063206470 AA already discloses a strip coating installation comprising two processing chambers and two process rollers, in the case of which the two process rollers are arranged in such a way that both sides of the strip can be coated one after the other.

JP 00063020464 AA also discloses an installation for vapor deposition on one side of a steel strip, comprising winding-up and unwinding rollers, which are arranged outside the processing chamber. The winding-up and unwinding devices are connected to the processing chamber by means of air locks.

Furthermore, DE 10 2005 042762 A1 discloses a strip coating installation in which the interior of the vacuum chamber is separated into a roller chamber and a coating chamber by a separating wall. Winding-up and unwinding rollers are likewise located in the vacuum chamber.

WO 2005/116289 discloses a further strip treatment installation, in which a change of unwinding and winding-up reels is possible without venting the entire installation or the evacuated treatment section thereof. For this purpose, the winding station and the treatment station are arranged in or on different bases that are movable in relation to each other. The base of the treatment station is a fixed part of the installation housing, which in the operating state also surrounds the winding station. The latter are arranged in a framework which encloses their common base, is open toward the treatment module, is movable with respect to the installation housing and can be sealed with respect to the actual treatment station by valves. From the outside, the winding stations are accessible via separate openings in the installation housing that can be tightly closed during operation.

In the case of the known methods, the substrate in strip form is guided between a treatment station and the winding stations by means of deflecting rollers, which contact the front side of the substrate.

For the production of thin-film solar cells, for example on the basis of copper-indium-selenite (CIS) with a transparent zinc-oxide window layer, one-sided coating of substrates in strip form is performed by means of PVD or CVD processes. During the one-sided coating, the substrate in strip form is only contacted on the rear side when the coating has taken place on the front side. It may also be necessary in the case of other processes to minimize or entirely avoid contacting a front side of a substrate. This requirement is the motivation for a treatment installation without the customary strip deflecting rollers, which contact the substrate on the front side.

BRIEF SUMMARY OF THE INVENTION

The invention provides a treatment installation of the type in question and a method of the type in question for the vacuum treatment, in particular vacuum coating, of substrates in strip form in which no contact with the front side of the substrate is necessary for guiding the substrate.

In the case of a treatment installation for the vacuum treatment, in particular vacuum coating, of at least one region of a front side of substrates in strip form in a first process chamber with a first process roller and at least one process source and a second process chamber with a second process roller and at least one process source, it is provided according to the invention that there is a transfer chamber which is arranged between the first and second process chambers, is coupled with both process chambers and can be separated in terms of pressure from at least one of the process chambers and an unwinding device with a removable unwinding reel and a winding-up device with a removable winding-up reel for the substrate to be treated as well as an outside air lock for loading and unloading the unwinding reel and/or winding-up reel, wherein the substrate to be treated is facing with its rear side toward the first and second process rollers and can be guided through the transfer chamber from the unwinding device to the first process roller, from the first process roller to the second process roller and from the second process roller to the winding-up device.

The region to be coated of the front side is preferably a strip parallel to the edges of the substrate in strip form that may also extend over the entire width of the substrate.

The arrangement of the transfer chamber between the first and second process chambers and the guiding of the substrate to be coated through the transfer chamber from the unwinding device to the first process roller, from the first process roller to the second process roller and from the second process roller to the winding-up device makes it possible to dispense with deflecting rollers that contact a predetermined region, preferably the region to be coated, of the front side of the substrate in strip form. It goes without saying that contact with the region concerned of the substrate in strip form by other components of the installation can also be avoided.

It is preferred if the guiding devices, in particular rollers and deflecting rollers, for the substrate to be treated between the unwinding device and the first process roller, between the first process roller and the second process roller and/or the second process roller and the winding-up device only contact the rear side of the substrate or, correspondingly, the front side of the substrate is guided contactlessly, at least in the predetermined region.

However, it also goes without saying that the invention includes embodiments in which contact with the front side of the substrate in strip form by components of the installation does take place, for example under precisely defined conditions.

It is provided with particular preference that the first and second process chambers are coupled with the transfer chamber in such a way that the unwinding reel and/or winding-up reel can be loaded into the transfer chamber and can be unloaded from the transfer chamber and during this the vacuum is maintained in at least one of the process chambers. The loading or unloading of the transfer chamber can therefore take place without venting of the entire installation. It is favorable if the transfer chamber has an intermediate chamber connecting the first and second process chambers, as well as a lock chamber separated from the intermediate chamber by a wall, wherein the intermediate chamber forms a channel for the substrate to be coated in which the substrate to be coated runs from the first process chamber to the second process chamber. The lock chamber is coupled with the first process chamber by a first strip lock and with the second process chamber by a second strip lock. The strip valves may be formed as pinch valves, which during the operation of the installation have an adequately large cross section to ensure that the substrate runs through without contact. A suitable strip valve is known for example from WO 99/50472. Furthermore, the intermediate chamber may be coupled with the first and/or second process chamber by a first and/or second strip lock, whereby any devices provided for guiding the substrate in the intermediate chamber or other components for performing servicing or adjusting work are accessible without the vacuum in the process chambers having to be broken, via access openings possibly provided.

If the first and/or second process roller is/are coolable and/or heatable, that is to say is/are formed as a cooling and/or heating roller, the substrate in strip form can be kept in a predetermined temperature range during the coating, and consequently the quality and reliability of the process can be ensured or enhanced.

In order to achieve efficient processing of the substrate, it is advantageous if a plurality of process sources are arranged in the process chamber or chambers. The plurality of process sources form on the front side of the substrate in strip form running through a process region that increases with the number of process sources. For reliable process control, it is advantageous if the process region of the process sources lies in a region where the substrate wraps around the process roller, since then the substrate is provided with support by the process roller during the action of the process sources. Great effectiveness of the installation is achieved if the substrate wraps around the process roller in a process region of the process sources with a wrap of at least 180°. In a further embodiment, a wrap with more than 180° may also be provided. The degree of wrap may be determined or set by the relative positioning of the winding-up and unwinding devices in relation to the first or second process roller, respectively.

The treatment installation serves with preference for the vacuum coating of substrates, wherein sputter sources, magnetron sputter sources, vapor coating, plasma, PVD or CVD sources are used as process sources. It goes without saying that sources for the pretreatment, cleaning, drying, surface activation and/or polymerization of the substrate to be treated are also conceivable. If the source is a sputter source, it may have a planar target or a cylindrical target. Furthermore, the first process chamber may be equipped with a process source with a planar target and the second process source may be equipped with a cylindrical target. Similarly, a converse configuration is conceivable. Such configurations may be used particularly favorably for the production of CIGS solar cells. A planar target is used with preference for coating with undoped zinc (i-ZnO), while cylindrical targets are preferred for the production of doped ZnO layers. It goes without saying that other configurations of planar and cylindrical targets are also conceivable for other treatment processes.

According to a further aspect of the invention, in the case of a method for the vacuum treatment of a front side of substrates in strip form in a process chamber with a process roller and at least one process source and a second process chamber with a process roller and at least one process source, the substrate to be treated is guided from an unwinding device to the first process roller, from the first process roller to the second process roller and from the second process roller to a winding-up device, and during this is facing with its rear side toward the first and second process rollers. The unwinding device and the winding-up device are arranged in a transfer chamber which is arranged between the first and second process chambers, is coupled with both and can be separated in terms of pressure from at least one of the process chambers. The method according to the invention has the advantage that the guiding of the substrate in strip form to be treated between the winding-up device and the unwinding device does not require any contact with the front side to be treated of the substrate in strip form by deflecting rollers.

BRIEF DESCRIPTION OF THE DRAWING

Preferred embodiments of the invention are described in more detail below on the basis of a drawing, from which further aspects and advantages of the invention also emerge independently of how they are grouped together in the patent claims.

FIG. 1 shows a greatly simplified representation of a treatment installation according to the invention for the vacuum treatment of a substrate 10 in strip form in a vertical section in relation to the axes of rotation of two process rollers.

DETAILED DESCRIPTION OF THE INVENTION

The treatment installation comprises a first process chamber 20 with a process roller 21, a second process chamber 30 with a process roller 31 and a transfer chamber 40 arranged between the first and second process chambers. Furthermore, control devices (not represented) for controlling the treatment process are provided.

The process rollers 21 and 31 are arranged in roller frames (not represented), which for example allow an adjustment of their axial positions and have axes of rotation arranged substantially parallel to each other. The transfer chamber 40 is coupled with the process chambers 20 and 30. The process chambers 20, 30 and the transfer chamber 40 can be evacuated by vacuum pumps (not presented). Arranged in the transfer chamber 40 are an unwinding device 50 for an unwinding reel, which provides a supply of strip material, and a winding-up device 60 with a winding-up reel. The axes of the winding-up reel and the unwinding reel are preferably arranged parallel to each other and to the axes of the process rollers.

Provided as the substrate 10 in strip form are metal strips, magnetic tapes, films, sheets of plastic or the like that are exposed to the process sources 21, 31 with one side for treatment, for example for coating.

At least one process source 22, preferably a number of process sources 22 is/are arranged in the process chamber 20. Similarly, at least one process source 32, preferably a number of process sources 32, is/are arranged in the process chamber 30. With preference, the process sources 22, 32 are magnetron sputter sources. However, it is conceivable for other sputter sources, vapor-coating, plasma, PVD or CVD sources to be used as well. Furthermore, the process sources may also be sources for the pretreatment, cleaning, drying, surface activation and/or polymerization of the substrate to be treated. A source preferably extends in each case over a predetermined length parallel to the axis of rotation of the respective process roller. Furthermore, as represented in FIG. 1, the process sources 22 and/or 32 are arranged around the respective process roller 21 or 31 in the manner of a circular ring, in order to form a treatment zone that is as large as possible for the substrate 10.

For the purposes of the invention, the side of the substrate 10 that is subjected to a treatment, preferably a coating, in the process chamber 20 and the process chamber 30 by the process sources 22 and/or 32 is defined as the front side 12 of the substrate 10 in strip form. The front side 12 is preferably, but not necessarily, directed radially outward during winding-up and/or unwinding. The opposite side of the substrate 10 is referred to as the rear side 13.

The transfer chamber 40 comprises an intermediate chamber 41 and a lock chamber 42, which are separated by a wall 45. The intermediate chamber 41 forms a channel for the substrate to be treated, in which the latter runs from the first process chamber 20 to the second process chamber 30. The intermediate chamber 41 may be separated in terms of pressure from the process chamber 20 or 30 by strip valves 46 and 47, respectively. The strip valves 46 and 47 are optional, and so, according to a further aspect of the invention, either both valves or one of these valves is/are omitted.

The lock chamber 42 is coupled with the first process chamber 20 by a strip lock 52 and with the second process chamber 30 by a strip lock 62.

It is evident that the first process chamber 20 and the second process chamber 30 are coupled with the transfer chamber 40 in such a way that unwinding reels or winding-up reels can be loaded into or unloaded from the transfer chamber 40, wherein the vacuum or a pressure that has been set is maintained in at least one of the process chambers 20 or 30. The wall 45 separating the intermediate chamber 41 from the lock chamber 42 adjoins or extends into a region of the process chamber 20 and a region of the process chamber 30. With the strip valves 52 and 62 closed, the lock chamber 42 is separated in terms of pressure/in terms of vacuum from the process chamber 20 and the process chamber 30, and so the unwinding reels 50 and the winding-up reels 60 are accessible via the outside air lock 44, without having to vent the process chamber 20 or the process chamber 30.

According to a further aspect of the invention, the transfer chamber 40 is formed as one part.

The process roller 21 and/or the process roller 31 may be respectively formed as a heating roller and/or a cooling roller, as already known per se.

The strip valves 46, 47, 52, 62 have in the opened state an adequately great clearance to allow contactless transporting of the substrate in strip form. In the closed state, they allow decoupling in terms of pressure of the respective process chamber from the transfer chamber. In addition, in the closed state of a strip lock, the substrate 10 in strip form can be securely held by the respective strip lock. This is advantageous to detach partial lengths of the substrate 10 in strip form and possibly attach a further supply of substrate to the securely held end, for example by tacking or welding.

The unwinding device 50 is disposed adjacent to a guiding device 51, which is facing with its rear side 13 toward the substrate 10 in strip form, and so no contact with the front side 12 takes place. Furthermore, the winding-up device 60 is disposed adjacent to a guiding device 61, which likewise operates without contact with the front side 12. Also provided in the region of the intermediate chamber 41 are guiding devices 43, which do not contact the front side 12 of the substrate in strip form, and so the substrate 10 can be guided without contact with its front side 13.

During operation of the installation, the substrate 10 in strip form is facing with its rear side 13 toward the process roller 21 and the process roller 22. The substrate in strip form to be treated is guided from the unwinding device to the process roller 21, wraps around the latter and, deflected by it, is guided in the direction of the process roller 31. Between the process roller 21 and the process roller 31, the substrate in strip form is guided through the transfer chamber 40. In the representation of FIG. 1, a transfer of the substrate 10 takes place through the intermediate chamber 41, forming a tunnel with a relatively small clear cross section.

The substrate 10 wraps around the process roller 31 and is deflected and guided by means of the strip valve 62 to the winding-up device 60. During the transport between the unwinding device 50 and the winding-up device 60 and the treatment of the substrate in the treatment installation according to the invention, no contact with the front side 12 of the substrate is necessary. All deflecting and guiding devices engage on the rear side 13 of the substrate in strip form, and so damage or contamination of the front side 12 can be minimized or prevented completely.

The substrate in strip form may be arranged with its rear side 13 on an intermediate strip. If appropriate, the substrate 10 may be drawn off from an intermediate strip before the treatment in the treatment installation and applied again to an intermediate strip after the treatment. It goes without saying that a treatment of the substrate in strip form that comprises two or more layers arranged one on top of the other in the installation according to the invention or by means of the method according to the invention is also conceivable.

The invention claimed is:

1. A treatment installation for vacuum treatment, in particular vacuum coating, of at least one region of a front side of a substrate in strip form, comprising:

a first process chamber with a first process roller and at least one process source;

a second process chamber with a second process roller and at least one process source;

a transfer chamber disposed between the first and second process chambers such that the first process chamber is disposed at a first end of the transfer chamber and the second process chamber is disposed at a second end of the transfer chamber, the first and second ends being oppositely disposed along a longitudinal axis of the transfer chamber, wherein the transfer chamber is coupled with both process chambers and can be separated in terms of pressure from at least one of the process chambers, wherein the transfer chamber comprises an unwinding device with a removable unwinding reel and a winding-up device with a removable winding-up reel for the substrate to be treated as well as an outside air lock for loading and unloading the unwinding reel and/or winding-up reel, the transfer chamber being disposed such that the unwinding device and the winding-up device are positioned between the first and second process chambers, wherein the substrate to be treated is facing with a rear side toward the first and second process rollers and can be guided through the transfer chamber from the unwinding device to the first process roller, from the first process roller to the second process roller and from the second process roller to the winding-up device, wherein the substrate to be treated wraps around the first process roller in the first process chamber in a first process region of the at least one process source of the first process chamber and wraps around the second process roller in the second process chamber in a second process region of the at least one process source of the second process chamber, wherein at least during a predetermined operating state, the substrate after treatment in the first process chamber is only facing with a rear side towards a guiding device or guiding devices and/or the substrate after treatment in the second process chamber is only facing with a rear side towards a guiding device or guiding devices before being up-winded by the winding-up device;

wherein the first and second process chambers and the first and second process rollers each includes a generally circular cross-section, each of the first and second process rollers being disposed concentrically within an outer wall of each of the first and second process chambers respectively about a respective central axis, the at least one process source of each of the first and second process chambers being arranged concentrically about the respective central axis between the outer wall and the process roller in the respective process chamber;

wherein the transfer chamber is elongated and extends from the first process chamber to the second process chamber along the longitudinal axis where the longitudinal axis is substantially perpendicular to and intersects the central axes, at least one of the first and second process chambers having a cross-sectional width greater than that of the transfer chamber.

2. The treatment installation as claimed in claim 1, wherein the first and second process chambers are coupled with the transfer chamber in such a way that the unwinding reel and/or winding-up reel can be loaded into the transfer chamber and can be unloaded from the transfer chamber and during which the vacuum is maintained in at least one of the process chambers.

3. The treatment installation as claimed in claim 2, wherein the transfer chamber comprises an intermediate chamber connecting the first and second process chambers and a lock chamber separated from the intermediate chamber by a wall, wherein the intermediate chamber forms a channel for the substrate to be treated in which the substrate to be treated runs from the first process chamber to the second process chamber and the lock chamber is coupled with the first process chamber by a first strip lock and with the second process chamber by a second strip lock.

4. The treatment installation as claimed in claim 3, wherein the intermediate chamber is coupled with the first process chamber by a third strip lock and/or with the second process chamber by a fourth strip lock.

5. The treatment installation as claimed in claim 1, wherein the first and/or second process roller is/are coolable and/or heatable.

6. The treatment installation as claimed in claim 1, wherein the at least one process source in the first process chamber comprises a plurality of process sources are arranged in the first process chamber and/or the substrate to be treated wraps around the first process roller in the first process region of the at least one process source of the first process chamber with a wrap of at least 180°.

7. The treatment installation as claimed in claim 1, wherein the at least one process source in the second process chamber comprises a plurality of process sources are arranged in the second process chamber and/or the substrate to be treated wraps around the second process roller in the second process region of the at least one process source of the second process chamber with a wrap of at least 180°.

8. The treatment installation as claimed in claim 1, wherein at least one guiding device for the substrate to be treated is arranged in an intermediate chamber.

9. The treatment installation as claimed in claim 1, wherein the unwinding device is disposed adjacent to at least one guiding device and/or the winding-up device is disposed adjacent to at least one guiding device for the substrate to be treated.

10. The treatment installation as claimed in claim 9, wherein, at least during a predetermined operating state, the substrate to be treated cannot be contacted/is not contacted by the guiding device or devices on a predetermined region of a front side and/or is only facing with a rear side toward the guiding device or devices.

11. The treatment installation as claimed in claim 9, wherein the guiding devices for the substrate to be treated are further disposed between the first process roller and the second process roller and/or the second process roller and the winding-up device only contact the rear side of the substrate or do not contact the front side of the substrate to be coated, at least in a predetermined region.

12. The treatment installation as claimed in claim 1, wherein at least one of the process sources is a sputter source, magnetron sputter source, vapor coating, plasma, PVD or CVD source or a source for a pretreatment, cleaning, drying, surface activation and/or polymerization of the substrate to be treated.

13. The treatment installation as claimed in claim 12, wherein the sputter or magnetron sputter source has a planar target.

14. The treatment installation as claimed in claim 12, wherein the sputter or magnetron sputter source has a cylindrical target.

15. The treatment installation as claimed in claim 12, wherein the first and/or second process chamber is/are equipped with at least one magnetron sputter source with a planar target and with at least one magnetron sputter source with a cylindrical target.

* * * * *